(12) United States Patent
Braun

(10) Patent No.: US 7,139,290 B2
(45) Date of Patent: Nov. 21, 2006

(54) TRANSMITTING DATA INTO A MEMORY CELL ARRAY

(75) Inventor: Georg Braun, Munich (DE)

(73) Assignee: Infineon Technologies AG, Munich (DE)

( * ) Notice: Subject to any disclaimer, the term of this patent is extended or adjusted under 35 U.S.C. 154(b) by 1072 days.

(21) Appl. No.: 10/171,098

(22) Filed: Jun. 13, 2002

(65) Prior Publication Data

US 2003/0012229 A1 Jan. 16, 2003

(30) Foreign Application Priority Data

Jun. 13, 2001 (DE) ............................... 101 28 770

(51) Int. Cl.
*H04J 3/08* (2006.01)
*G11C 8/00* (2006.01)
(52) U.S. Cl. ...................................... 370/536; 365/233
(58) Field of Classification Search ................ 370/536, 370/368, 392, 397; 709/214, 100; 345/502, 345/558, 555, 589, 600, 543, 533; 348/396, 348/391, 715, 439.1, 718; 714/761–764, 714/42; 708/520; 712/22, 10; 365/233
See application file for complete search history.

(56) References Cited

U.S. PATENT DOCUMENTS 5,014,235 A * 5/1991 Morton ........................ 708/520
5,717,904 A * 2/1998 Ehlers et al. ................ 345/543
5,835,448 A * 11/1998 Ohtani et al. ................ 365/233
5,867,446 A * 2/1999 Konishi et al. ............. 365/233

OTHER PUBLICATIONS

12/144-Mbit RDRAM Datasheet (32 Split Bank Architecture), Preliminary Information Version 1.11 Inc., 3465 Latham Street, Mountain View, CA, USA 94040, 2000, pp. 1-8.

* cited by examiner

*Primary Examiner*—Chi Pham
*Assistant Examiner*—Prenell Jones
(74) *Attorney, Agent, or Firm*—Fish & Richardson P.C.

(57) ABSTRACT

A method for transmitting a data stream from a circuit unit to a memory cell array includes receiving the data stream and demultiplexing it in response to a control signal, thereby dividing the data stream into a storage data stream and a mask data stream. The storage data stream is then buffered into a register unit, where it is divided into data stream components buffered in corresponding data register components on the basis of a clock signal and an address signal provided to the register unit. Meanwhile, the mask data stream is buffered in a mask register of the register unit. A composite data stream is then formed by combining selected data stream components in response to information provided by a data mask unit from the mask data stream buffered in the mask register. Data corresponding to this composite data stream is then provided to the memory cell array for storage therein.

12 Claims, 4 Drawing Sheets

TRANSMITTING DATA INTO A MEMORY CELL ARRAY

FIELD OF INVENTION

The present invention relates to data transmission, and in particular, to transmitting data streams into a memory cell array from a circuit unit at a high transmission rate.

RELATED APPLICATIONS

Under 35 USC 119, this application claims the benefit of the Jun. 13, 2001 priority date of German application 101 28 770.4, the contents of which are herein incorporated by reference.

BACKGROUND

As the integration density of semiconductor memories, for example synchronous DRAMs, SDRAMs or DDR-DRAMs, has increased, greater requirements have been made of a data transmission rate when transmitting data streams from external circuit units to a memory cell array of a semiconductor memory. In principle two measures can be taken to increase a data transmission rate.

(i) A width of a chip-internal data bus is increased or a width of internal data transmission paths is increased; and (ii) A clock frequency is increased.

Generally, a data transmission rate is calculated per connecting unit (or pin) in megabits per second (Mbit/s per connecting unit). For example, a conventional personal computer device under the designation PC100 has a data transmission rate of 100 Mbit/s per connecting unit (pin), it being possible to make available 1600 Mbit/s per PC100 device with a customarily provided arrangement of 16 connecting units (pins).

It is thus possible to detect that a data transmission rate increases proportionally to an increase in a number of connecting units. However, for reasons of fabrication technology and for reasons of the handling capabilities of PC devices, the maximum number of connecting units is limited, as a result of which an increase in a data transmission rate is limited by making data transmission paths wider.

Furthermore, with conventional arrangements the clock frequency which determines the data transmission rate is disadvantageously limited. Striking a balance between the clock frequency and a bus width or a width of data transmission paths leads to a situation in which each connecting unit (pin) of a PC device has to be utilized to an optimum degree or as effectively as possible.

FIG. 3 shows a conventional circuit arrangement for transmitting data between an (external) circuit unit (103) and a memory cell array (102). A 16-bit-wide data transmission path connects the external circuit unit (103) to a storage data stream connecting unit 300a, which in turn transmits a storage data stream 303 to a storage data stream receiver 304 via a data transmission path which is also 16 bits wide. At the same time, i.e. parallel to the transmission described above, a 1-bit-wide mask data stream 305 is transmitted to a mask data stream connecting unit 300 and from there on to a mask data stream receiver 302, also via a 1-bit-wide data transmission path.

The mask data stream 305 is supplied to two mask register components 301a, 301b of a mask register 301 which is located within a register unit 115. The storage data stream 303 is fed via a 16-bit-wide data transmission path to data register components 108a, 108b which are arranged in a data register 108 which forms the other part of the register unit 115.

It is thus a disadvantage of conventional circuit arrangements for transmitting data into a memory cell array 102 that an additional connecting unit 300 has to be made available for the transmission of the mask data stream 305. It is in particular inexpedient to make available a 1-bit-wide data transmission path for the mask data stream 305 which only contains information on which data of the storage data stream 303 are to be ultimately transmitted to the memory cell array 102.

SUMMARY

An object of the present invention is therefore to make available a method and a circuit arrangement for transmitting data into a memory cell array in which the data is transmitted in the form of data streams from a circuit unit into a memory cell array at a high data transmission rate, mask data streams and storage data streams not being transmitted in parallel but rather in a time-division multiplexed form so that a saving is made in connecting units (pins) of the circuit arrangement.

An essential thought of the invention is that data stream units which relate to a data mask, and data stream units which correspond to the data to be stored in a memory cell array, are transmitted separately and in a time-division multiplexed form.

One advantage of the method according to the invention for transmitting data into a memory cell array is thus that a saving is made in connecting units (pins).

Furthermore, it is advantageous that a high data transmission rate can be achieved on existing data transmission paths with existing connecting units (connecting pins).

Existing data transmission paths (lines) are expediently used for transmitting data from an (external) circuit unit into a memory cell array.

The method according to the invention for transmitting data into a memory cell array has essentially the following steps:

a) reception of the at least one data stream which originates from at least one external circuit unit in a data stream receiver;

b) demultiplexing of the received data stream in a demultiplexer device as a function of a control signal supplied by a control device, as a result of which the received data stream is divided into a storage data stream and a mask data stream or is time-division demultiplexed, the control device specifying a control signal which establishes a demultiplexing clock rate;

c) buffering of the storage data stream in a data register of a register unit, the storage data stream being divided into at least one data register component of the data register of the register unit as a function of at least one clock signal and at least one address signal which are applied to the register unit;

d) buffering of the mask data stream in a mask register of the register unit;

e) outputting of data stream components from the data register components;

f) combination of the data stream components which are made available by the data register components to form a composite data stream as a function of the at least one data mask unit made available by the mask data stream buffered in the mask register; and g) storage of the data corresponding to the composite data stream in the memory cell array, only that data which is supplied by the external circuit unit and is defined by the mark data stream being stored.

According to one preferred development of the present invention, the received data stream is formed by the at least one data mask unit and the at least one data word unit, which of the data word units are input into the composite data stream and are thus to be stored in the memory cell array being determined by the at least one data mask unit.

According to a further preferred development of the present invention, two 16-bit-wide data stream components are combined to form one 32-bit-wide composite data stream which is fed to the memory cell array, two n-bit-wide data stream components in general being combined to form one 2*n-bit-wide composite data stream if n is a number which is 4, 8 or 32.

According to yet another preferred embodiment of the present invention, data is transmitted in the form of data streams from the external circuit unit into the memory cell array at a high data transmission rate, the data streams being formed from at least one data mask unit and at least one data word unit.

According to yet another preferred development of the present invention, the at least one data mask unit of the data stream is used to set a length of the following data word units.

According to yet another preferred development of the present invention, the first unit which is received in the register by means of the data stream is at least one data mask unit which is used to determine which of the data word units are input into the composite data stream and are thus to be stored in the memory cell array.

According to yet another preferred development of the present invention, information relating to the data stream to be transmitted is transmitted on data transmission paths provided for the data stream upstream of the data stream to be transmitted.

The circuit arrangement according to the invention for transmitting data into a memory cell array also has:

a) a data stream receiver for receiving the at least one data stream from the (external) circuit unit;

b) a demultiplexer device for demultiplexing the received data stream as a function of a control signal supplied by a control device, as a result of which the received data stream is divided or demultiplexed or chronologically separated into a storage data stream and a mask data stream;

c) at least one data register of a register unit for buffering the storage data stream, the storage data stream being divided up or demultiplexed into at least one data register component of the data register of the register unit as a function of at least one clock signal and at least one address signal which are applied to the register unit; and d) at least one memory cell array for storing the data corresponding to the composite data stream and has been transmitted by the external circuit unit.

Exemplary embodiments of the invention are illustrated in the drawings and described in more detail in the following description.

BRIEF DESCRIPTION OF THE FIGURES

In the figures, identical reference numerals designate identical or functionally identical components or steps.

DETAILED DESCRIPTION

Figure 1:
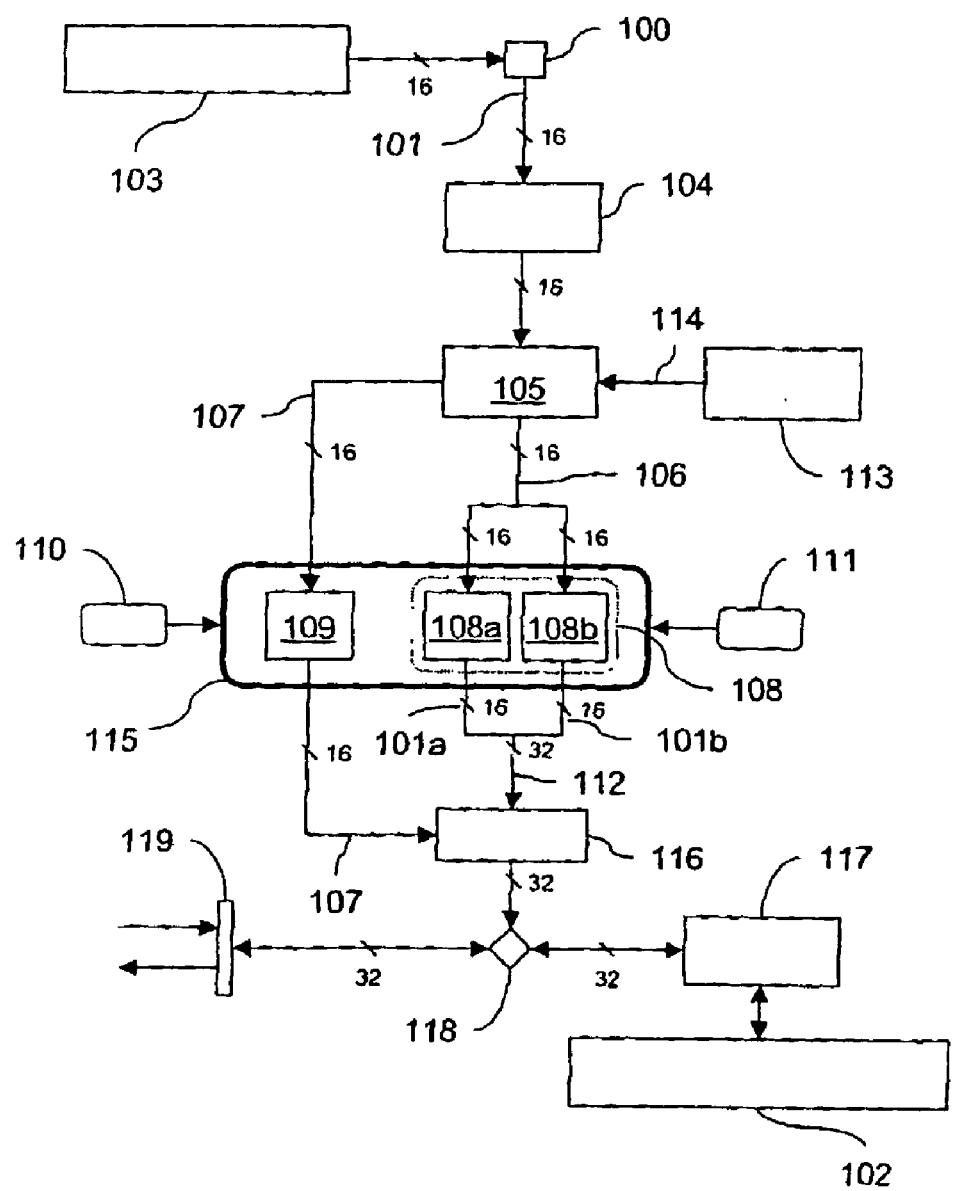
FIG. 1 shows a circuit arrangement for carrying out the method according to the invention for transmitting data from a circuit unit into a memory cell array.

In the circuit arrangement shown in FIG. 1, a 16-bit-wide data stream 101 is supplied to a data stream connecting unit 100 by a circuit unit 103. One or more circuit units 103 can be connected to the data stream connecting unit 100, it being possible for the circuit units 103 also to be arranged externally.

From the data stream connecting unit 100, the 16-bit-wide data stream 101 is supplied to a data stream receiver 104 in which the data stream is prepared for further processing in the circuit arrangement shown in FIG. 1. A 16-bit-wide data transmission path connects the data stream receiver 104 to a demultiplexer device 105. In the demultiplexer device 105, the 16-bit-wide data stream 101 is time-division demultiplexed into a 16-bit-wide storage data stream 106 which contains data which, after evaluation in a register 115, is to be finally entirely or partially stored in a memory cell array 102, is selected, and into a mask data stream 107 [sic].

The demultiplexer device 105 is driven via a control device 113 which makes available a control signal 114 to the demultiplexer device 105. With the control signal it is decided whether the data stream 101 supplied to the demultiplexer device 105 is supplied as a mask data stream 107 to a mask register 109 of the register unit 115 or as a storage data stream 106 to a data register 108 of the register unit 115.

According to the information contained in the mask data stream 107, in particular according to the information contained in at least one data mask unit 201a–201n of a data stream (described further below with reference to FIG. 2) and as a function of a clock signal 110 supplied to the register unit 115 and an address signal 111 supplied to the register unit 115, the storage data stream 106 is divided alternately into a data register component 108a and a data register component 108b of the data register 108 in the register unit 115.

Only data which is defined as "valid" by at least one data mask unit 201a–201n (see description below referring to FIG. 2), i.e. only that data which is ultimately to be stored in the memory cell array 102, is made available as data stream components 101a and 101b. The two 16-bit-wide data stream components 101a and 101b are combined to form a 32-bit-wide composite data stream 112 which is supplied to a driver device 116.

The mask data stream 107 is also supplied to the driver device 116 by the mask register. The driver device 116 then firstly communicates via a 32-bit-wide data transmission path with a connecting device 118 which is connected via further 32-bit-wide data transmission paths to a circuit connecting unit 119, on the one hand, and to a switching device 117, on the other. The circuit connecting unit 119 serves to connect further external circuit units via data buses or via data transmission paths, further details not being given on these here.

Figure 4:
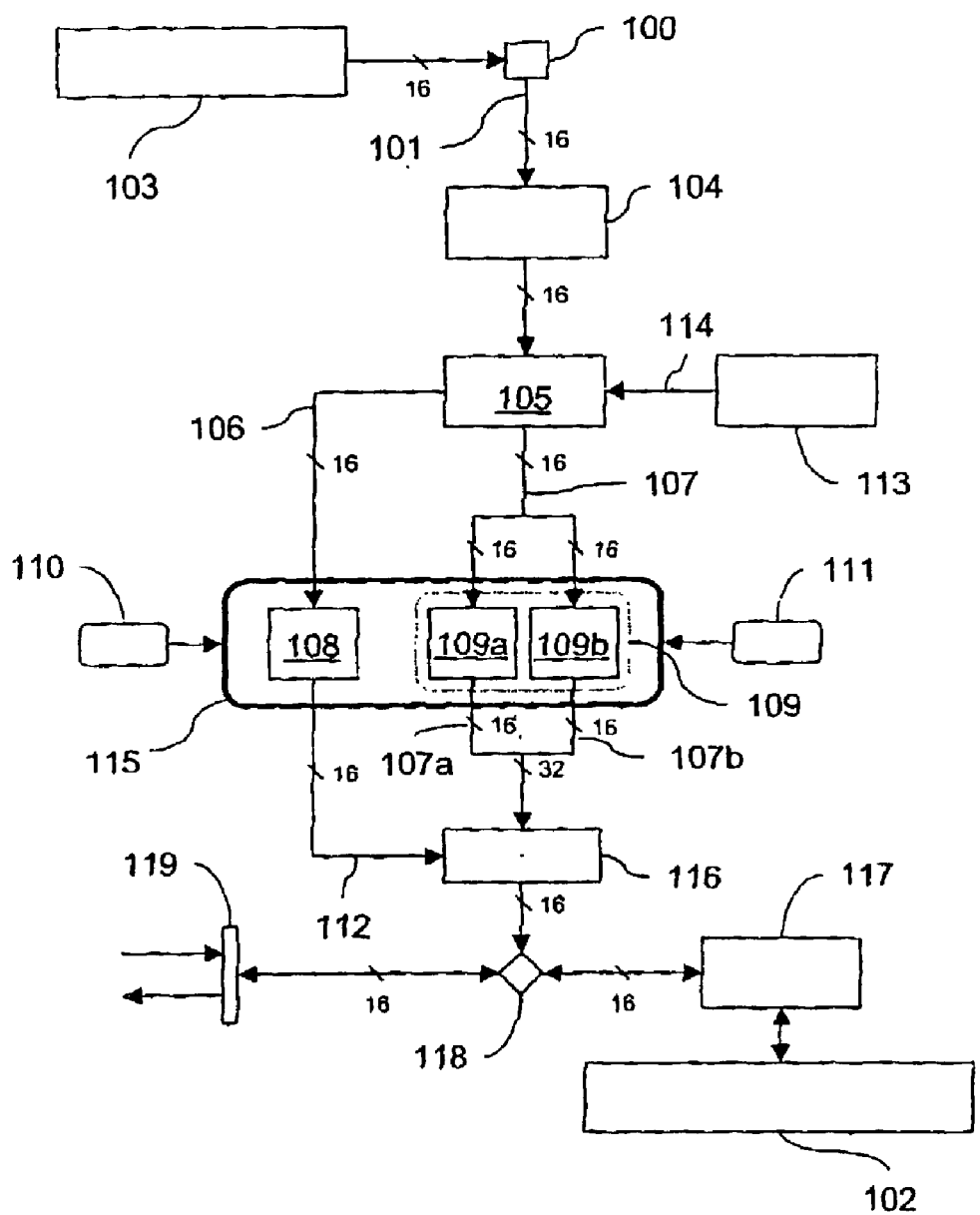
FIG. 4 shows an alternative circuit arrangement for carrying out the method according to the invention for transmitting data from a circuit unit into a memory cell array.

It is to be noted that to carry out the method according to the invention it is not absolutely necessary to drive further external circuit units via data buses so that if there are no other external circuit units present, the connecting device 118 and the circuit connecting unit 119 in the circuit arrangements shown in FIGS. 1 and 4 can be dispensed with.

In accordance with the information contained in the at least one data mask unit 201a–201n, the switching device 117 switches the "valid" data on to the memory cell array 102 in which the data corresponding to the composite data stream 112 is ultimately stored.

The register unit 115 is composed of at least one data register 109 and at least one data register 108, the data register 108 being formed from at least one data register component 108a, 108b.

Figure 2:
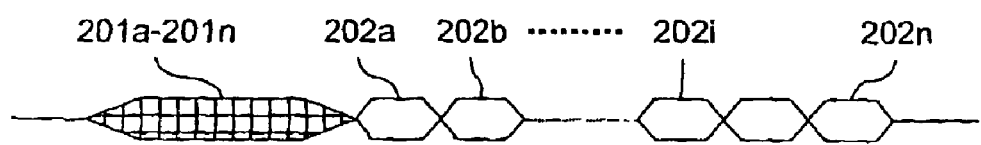
FIG. 2 is a schematic view of a data stream which is formed from at least one data mask unit and at least one data word unit which follows the at least one data mask unit.

As is shown in FIG. 2, the data stream 101 is formed from at least one data mask unit 201a–201n and at least one data word unit 202a–202n following the at least one data mask unit 201a–201n. The information contained in the at least one data mask unit 201a–201n specifies which of the following data word units 202a–202n is to be transmitted, i representing a serial index which indicates that one or more data word units 202a–202n may be present.

It is to be noted that a data word unit 202a–202n can be transmitted synchronously or asynchronously with respect to the clock signal 110. Furthermore, a variable "pause" may be present between individual data words.

FIG. 4 illustrates an alternative circuit arrangement for carrying out the method according to the invention for transmitting data from a circuit unit into a memory cell array.

The circuit arrangement shown in FIG. 4 has a single data register 108 and two mask registers 109a and 109b, at least two mask data stream components 107a, 107b being obtained from the mask data stream 107.

Again, only data which is defined as "valid" by at least one data mask unit 201a–201n (see description above referring to FIG. 2), i.e. only that data which is ultimately to be stored in the memory cell array 102, is made available as composite data stream 112. The, in contrast to FIG. 1, only 16-bit-wide composite data stream 112 is fed to the driver device 116.

The mask data stream components 107a, 107b are also supplied to the driver device 116 by the mask registers 109a, 109b. The driver device 116 then firstly communicates via a 16-bit-wide data transmission path with a connecting device 116 which is connected via further 16-bit-wide data transmission paths to a circuit connecting unit 119, on the one hand, and to a switching device 117, on the other. The circuit connecting unit 119 serves to connect further external circuit units via data buses or via data transmission paths, as already mentioned further details are not given on these.

It is to be noted that any desired combinations of any desired number of data register components 108a, 108b and mask registers 107a, 107b are possible so that the circuit arrangements shown in FIGS. 1 and 4 are only illustrative by way of an example.

In particular, the data register 108 can be divided into more than the two data register components 108a, 108b shown in FIG. 1, and the mask register 109 can be divided into more than the two units 107a, 107b shown in FIG. 4.

As a result of the method according to the invention for transmitting data into a memory cell array 102 in which data is transmitted in the form of data streams 101 from a circuit unit 103 to the memory cell array 102 at a high data transmission rate, an existing number of connecting units (pins) can remain constant, as a result of which a saving is made in costs in a circuit configuration.

In particular, it is advantageous in the circuit arrangement according to the invention that a mask data stream connecting unit or a data mask pin is eliminated.

Figure 3:
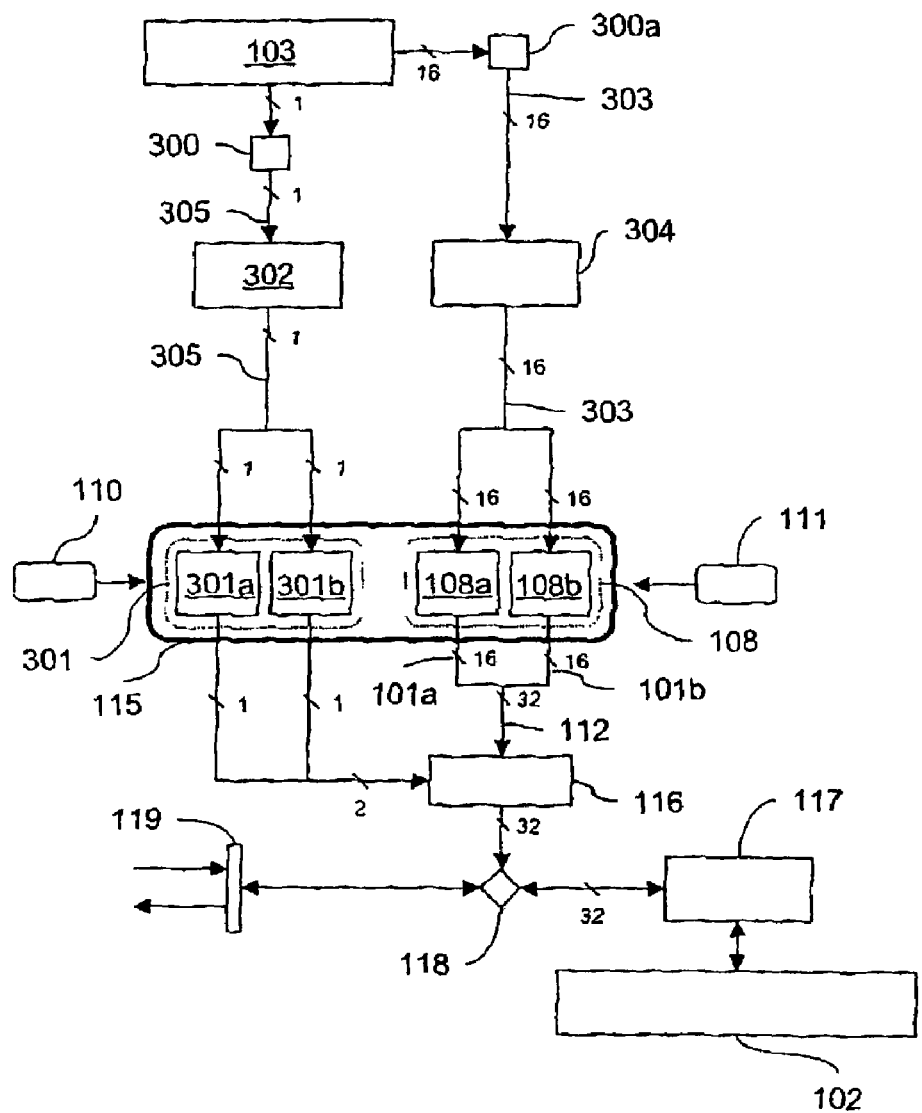
FIG. 3 shows a conventional circuit arrangement for transmitting data from a circuit unit into a memory cell array.

Reference is to be made to the introduction to the description for information on the conventional circuit arrangement (illustrated in FIG. 3) for transmitting data from a circuit unit into a memory cell array.

Although the present invention has been described above with reference to preferred exemplary embodiments, it is not restricted to them but rather can be modified in various ways.

Having described the invention, and a preferred embodiment thereof, what is claimed as new, and secured by Letters Patent, is:

1. A method for transmitting a data stream from a circuit unit to a memory cell array, the method comprising:
   receiving the data stream;
   demultiplexing the data stream in response to a control signal, thereby dividing the data stream into a storage data stream and a mask data stream;
   buffering the storage data stream in a register unit, the storage data stream being divided into data stream components buffered in corresponding data register components on the basis of a clock signal and an address signal provided to the register unit,
   buffering the mask data stream in a mask register of the register unit;
   forming a composite data stream by combining selected data stream components in response to information provided by a data mask unit from the mask data stream buffered in the mask register; and
   providing the data corresponding to the composite data stream to the memory cell array for storage therein.

2. The method of claim 1, wherein
   receiving a data stream comprises receiving a data stream having a data mask unit and a data word unit, and
   forming a composite data stream comprises selecting, on the basis of the data mask unit, a data word unit for inclusion in the composite data stream.

3. The method of claim 1, wherein forming a composite data stream comprises combining two n-bit-wide data stream components to form a 2*n-bit-wide composite data stream, n being a number selected from the group consisting of 4, 8, 16 and 32.

4. The method of claim 1, wherein receiving the data stream comprises receiving a data stream formed from a data mask unit and a data word unit.

5. The method of claim 2, further comprising setting a length of the data word unit on the basis of the data mask unit.

6. The method of claim 1, wherein receiving the data stream comprises receiving a data mask unit that precedes a plurality of data word units, the data mask unit containing information indicative of which of the plurality of data word units is to be included in the composite data stream for storage in the memory cell array.

7. The method of claim 1, further comprising:
   providing a data transmission path upstream from the data stream to be transmitted, and
   transmitting information relating to the data stream on the data transmission path.

8. A circuit arrangement for transmitting a data stream from a circuit unit to a memory cell array, the circuit arrangement comprising:

a data stream receiver for receiving the data stream from the circuit unit;

a demultiplexer device configured to demultiplex the received data stream in response to a control signal, thereby dividing the data stream into a storage data stream and a mask data stream;

a register unit for buffering the storage data stream and forming a composite data stream therefrom; and a memory cell array for storing the data corresponding to the composite data stream.

9. The circuit arrangement of claim 8, wherein the register unit comprises a mask register and a data register.

10. The circuit arrangement of claim 9, wherein the data register comprises a data register component.

11. The circuit arrangement of claim 8, wherein the data stream receiver is configured to receive a data stream having a data mask unit and a data word unit following the data mask unit.

12. The circuit arrangement of claim 9, wherein the data register comprises at least two data register components for storage of corresponding data stream components from the storage data stream.

* * * * *